United States Patent
Nakao

(10) Patent No.: US 9,651,723 B2
(45) Date of Patent: May 16, 2017

(54) OPTICAL FILTER MEMBER AND IMAGING DEVICE PROVIDED WITH THE SAME

(71) Applicant: KYOCERA Corporation, Kyoto-shi, Kyoto (JP)

(72) Inventor: Takahiro Nakao, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 332 days.

(21) Appl. No.: 14/411,234

(22) PCT Filed: Oct. 24, 2013

(86) PCT No.: PCT/JP2013/078842
§ 371 (c)(1),
(2) Date: Dec. 24, 2014

(87) PCT Pub. No.: WO2014/065373
PCT Pub. Date: May 1, 2014

(65) Prior Publication Data
US 2015/0253477 A1    Sep. 10, 2015

(30) Foreign Application Priority Data

Oct. 26, 2012   (JP) .................................. 2012-236963
Nov. 22, 2012   (JP) .................................. 2012-256398
(Continued)

(51) Int. Cl.
B32B 17/06   (2006.01)
G02B 5/20    (2006.01)
(Continued)

(52) U.S. Cl.
CPC ............. *G02B 5/208* (2013.01); *G02B 5/281* (2013.01); *G02B 5/282* (2013.01);
(Continued)

(58) Field of Classification Search
USPC ................................. 428/426, 428, 432, 688
See application file for complete search history.

(56) References Cited

U.S. PATENT DOCUMENTS 4,770,496 A * 9/1988 Mahlein ................. G02B 5/285
                                                        359/588
6,011,646 A   1/2000 Mirkarimi et al.
(Continued)

FOREIGN PATENT DOCUMENTS

CN      1918489 A      2/2007
JP      11-202127 A    7/1999
(Continued)

OTHER PUBLICATIONS

Korean Office Action with English concise explanation, Korean Patent Application No. 10-2014-7036530, Nov. 3, 2015, 6 pgs.
(Continued)

*Primary Examiner* — Lauren R Colgan
(74) *Attorney, Agent, or Firm* — Volpe and Koenig, P.C.

(57) ABSTRACT

An optical filter member includes a transparent base; and an optical film disposed on a surface of the base. The optical film includes a first, a second and a third dielectric multilayer films, in the respective multilayer films a plurality of dielectric layers having different refractive indexes being laminated. The first dielectric multilayer film has a first light transmission range within a wavelength of visible light. The second dielectric multilayer film has a second light transmission range falling within the first light transmission range and has an average refractive index higher than that of the first dielectric multilayer film. The third dielectric multilayer film blocks light having twice a wavelength of a central wavelength of the second light transmission range. The second dielectric multilayer film is disposed, together with
(Continued)

the first dielectric multilayer film or the third dielectric multilayer film, on a same main surface side of the base.

10 Claims, 10 Drawing Sheets

(30) Foreign Application Priority Data

Dec. 26, 2012 (JP) .................................. 2012-283045
Dec. 27, 2012 (JP) .................................. 2012-285338

(51) Int. Cl.
    *H01L 27/146*     (2006.01)
    *H04N 5/335*     (2011.01)
    *H04N 5/225*     (2006.01)
    *G02B 5/28*     (2006.01)

(52) U.S. Cl.
    CPC .. *H01L 27/14618* (2013.01); *H01L 27/14621* (2013.01); *H04N 5/2254* (2013.01); *H04N 5/335* (2013.01); *G02B 5/285* (2013.01); *H01L 2224/48091* (2013.01)

(56) References Cited

U.S. PATENT DOCUMENTS

| | | | | |
|---|---|---|---|---|
| 9,103,986 B2* | 8/2015 | Margalit | ................ | G02B 5/287 |
| 2003/0142407 A1* | 7/2003 | Kitagawa | ................ | G02B 7/008 |
| | | | | 359/586 |
| 2004/0207920 A1* | 10/2004 | Kitagawa | ................ | G02B 5/285 |
| | | | | 359/582 |
| 2005/0253048 A1* | 11/2005 | Kameda | ................ | G02B 5/282 |
| | | | | 250/226 |
| 2007/0127126 A1* | 6/2007 | Terada | ................ | G02B 5/0833 |
| | | | | 359/586 |
| 2009/0153971 A1* | 6/2009 | Takada | ................ | G02B 5/285 |
| | | | | 359/585 |
| 2010/0188737 A1 | 7/2010 | Terada | | |
| 2014/0247480 A1* | 9/2014 | Tatemura | ............... | G02B 5/282 |
| | | | | 359/359 |
| 2015/0346403 A1* | 12/2015 | Jidai | ........................ | B32B 7/02 |
| | | | | 348/164 |
| 2016/0077257 A1* | 3/2016 | Tatemura | ............... | G02B 5/208 |
| | | | | 359/360 |
| 2016/0238759 A1* | 8/2016 | Sprague | ................ | G02B 5/281 |

FOREIGN PATENT DOCUMENTS

| | | |
|---|---|---|
| JP | 2002-504715 A | 2/2002 |
| JP | 2002-353352 A | 12/2002 |
| JP | 2003-29027 A | 1/2003 |
| JP | 2004-069865 A | 3/2004 |
| JP | 2007-47530 A | 2/2007 |
| JP | 2007-183525 A | 7/2007 |
| JP | 2008-60121 A | 3/2008 |
| JP | 2008-158036 A | 7/2008 |
| JP | 2009-217138 A | 9/2009 |
| JP | 2013-178338 A | 9/2013 |
| WO | 2013/077375 A1 | 5/2013 |

OTHER PUBLICATIONS

Chinese Office Action with English concise explanation, Chinese Patent Application No. 201380033913.7, Mar. 9, 2016, 10 pgs.
International Search Report, PCT/JP2013/078842, Jan. 20, 2014, 2 pgs.

\* cited by examiner (a)

(b)

(a)

(b)

(c)

(a)

(b)

OPTICAL FILTER MEMBER AND IMAGING DEVICE PROVIDED WITH THE SAME

TECHNICAL FIELD

The present invention relates to an optical filter member and an imaging device provided with the same.

BACKGROUND ART

For example, in a color imaging device or the like including an imaging element such as a CCD or a CMOS, an optical filter member having a structure in which an optical film is formed on a surface of a base made of a light transmitting material is used as a component that blocks infrared light falling within a wavelength range outside a visible region. In the color imaging device or the like, if the infrared light falling within the wavelength range outside the visible region enters the imaging element, the accuracy of imaging is lowered. Thus, the optical filter that blocks the infrared light is used. The optical film in the optical filter member is a dielectric multilayer film in which two types of optical layers having different refractive indexes are alternately laminated to form 40 to 50 layers, for example. Here, the imaging device may include a lens that collects light into the optical filter member (for example, see Patent Literature 1).

CITATION LIST

Patent Literature

Patent Literature 1: Japanese Unexamined Patent Publication JP-A 2008-60121

SUMMARY OF INVENTION

Technical Problem

In recent years, as the imaging device becomes thinner, the distance between the lens and the optical filter member becomes smaller, and thus, the difference of incident angles of light that enters a central region of the optical filter member and light that enters a peripheral region of the optical filter member becomes larger. Since the dielectric multilayer film that forms the optical film has different optical characteristics according to the light incident angle difference, a color tone difference between a central region and a peripheral region of a captured image easily occurs due to the light incident angle difference, which may affect the image quality. Further, with respect to the optical filter member, it is also necessary to increase transmittance of light having a desired wavelength range in visible light to enhance the image quality.

Solution to Problem

According to an aspect of the invention, an optical filter member includes: a base formed of a light transmitting material; and an optical film disposed on a surface of the base, the optical film including a first, a second and a third dielectric multilayer films, in the respective multilayer films a plurality of dielectric layers having different refractive indexes being laminated, the first dielectric multilayer film having a first light transmission range within a wavelength of visible light, the second dielectric multilayer film having a second light transmission range falling within the first light transmission range and having an average refractive index higher than that of the first dielectric multilayer film, the third dielectric multilayer film having a third light transmission range within which the second light transmission range falls, the third dielectric multilayer film having an upper limit wavelength higher than an upper limit wavelength of the first light transmission range, the third dielectric multilayer film blocking light having twice a wavelength of a central wavelength of the second light transmission range, the second dielectric multilayer film being in contact with the base, the second dielectric multilayer film being disposed, together with the first dielectric multilayer film or the third dielectric multilayer film, on a same main surface side of the base.

According to another aspect of the invention, an imaging device includes: the optical filter member having the above configuration; and an imaging element disposed under the optical filter member.

Advantageous Effects of Invention

The optical filter member according to one aspect of the invention is capable of reducing a change of an optical characteristic due to a light incident angle difference, and of securing a desired light transmission range.

The imaging device according to another aspect of the invention is capable of enhancing the image quality by including the optical filter member.

DESCRIPTION OF EMBODIMENTS

Hereinafter, exemplary embodiments of the invention will be described with reference to the accompanying drawings.

Figure 1:
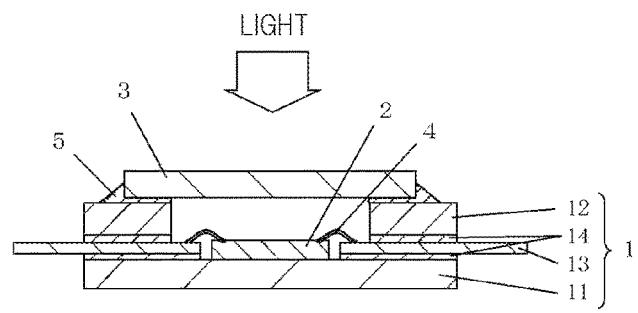
FIG. 1 is a longitudinal sectional view illustrating an imaging device according to an embodiment of the invention.

As shown in FIG. 1, an imaging device according to an embodiment of the invention includes an element mounting member 1, an imaging element 2 mounted on the element mounting member 1, and an optical filter member 3 disposed above the imaging element 2. The optical filter member 3 blocks a specific wavelength range in light applied onto the imaging device. In the present embodiment, the optical filter member 3 cuts off light in an infrared wavelength range, for example.

First, the optical filter member 3 according to the present embodiment will be described with reference to FIGS. 2 to 7. Other configurations of the imaging device will be described later. In FIGS. 2 to 7, an example in which a second dielectric multilayer film 33 is disposed, together with a third dielectric multilayer film 34, on the same main surface side of a base 31 and a first dielectric multilayer film 32 is disposed on the other main surface side of the base 31 is shown.

The optical filter member 3 includes the base 31 formed of a transparent and colorless flat plate, and an optical film disposed on a surface of the base 31. The optical film includes the first dielectric multilayer film 32, the second dielectric multilayer film 33, and the third dielectric multilayer film 34 in which plural dielectric layers having different refractive indexes are laminated, respectively.

The first dielectric multilayer film 32 is disposed in contact with one main surface of the base 31, and the second dielectric multilayer film 33 is disposed in contact with the other main surface of the base 31. The third dielectric multilayer film 34 is disposed on the second dielectric multilayer film 33.

The base 31 is formed of a glass material such as borosilicate glass, a birefringent material such as lithium niobate, quartz crystal or sapphire, or a polymeric material such as acrylic resin, for example.

When the base 31 is formed of the glass material, the base 31 is formed in a block shape by pouring a melted glass material with high purity into a container made of metal having a melting point higher than a melting temperature of the glass, preferably configured to effectively prevent impurities (for example, platinum (Pt)) from being mixed therein, and by gradually cooling the resultant over several days. Then, the block is cut to have a predetermined thickness and predetermined external dimensions. Then, lap polishing is performed using an abrasive made of alumina or the like, and then, optical polishing is performed using an abrasive made of alumina, cerium oxide or the like to form the base 31. Through such manufacturing, it is possible to prevent impurities that generate an alpha ray that badly affects the imaging element 2 from being mixed into the high purity glass material.

Further, the borosilicate glass becomes a material having an excellent heat-resisting property or a chemical resistant property by adding boron to the glass material, and is configured to have a transparent and flat non-porous surface to be preferably used as a material having few optical defects.

The above-mentioned borosilicate glass may be formed as a light transmitting flat substrate having less plate thickness irregularity without performing polishing by processing the melted high purity glass material by a downdraw method.

Further, when the base 31 is formed of lithium niobate, quartz crystal or sapphire, the lithium niobate, quartz crystal or sapphire is artificially grown to seed crystal within a growing furnace under high pressure and high temperature to form a single crystal block, and then, the resultant is cut into a wafer using a wire saw, a band saw or the like so that a cut surface has a predetermined angle with respect to a crystal axis.

Further, the wafer is cut to have a predetermined thickness and a predetermined external dimension, the wafer is chamfered by mechanically cutting respective ridgeline portions, and then, lap polishing is performed using an abrasive made of alumina or the like. Then, optical polishing is performed using an abrasive made of alumina, cerium oxide or the like, so that the lithium niobate, quartz crystal or sapphire can be formed as a light transmitting flat surface substrate, which becomes the base 31.

It is preferable that the base 31 has a thickness in a range of 0.03 mm to 0.5 mm, for example. As the thickness of the base 31 is 0.03 mm or greater, it is possible to maintain the strength of the base 31 as a structure material when the base 31 is used as a cover of the imaging device, and to airtightly seal the internal imaging element 2. Further, it is also possible to obtain a sufficient strength of the base 31. As the thickness of the base 31 is 0.5 mm or smaller, it is possible to obtain a thin thickness, and to realize reduction in the height of the imaging device. The reflectance of the base 31 is about several percentages over a range from 200 nm to 1200 nm. The first dielectric multilayer film 32 has a first light transmitting range W1 in a wavelength range of visible light. Here, the visible light refers to light falling within a wavelength range of 350 nm to 830 nm, for example. As shown in FIG. 5(b), in the first dielectric multilayer film 32 according to an example, the first light transmitting range W1 is a range from about 380 nm to about 700 nm in a transmittance of 50%. In FIG. 5(b), the first light transmitting range W1 is indicated by reference sign W1.

As shown in FIG. 5(b), the first dielectric multilayer film 32 has a configuration in which the transmittance of ultraviolet rays falling within a wavelength range shorter than 400 nm is reduced and the transmittance of infrared rays falling within a wavelength range longer than 700 nm is reduced. In order to obtain such a filter characteristic, the first dielectric multilayer film 32 includes a first low refractive index dielectric layer 32a and a first high refractive index dielectric layer 32b. The first high refractive index dielectric layer 32b is formed of a dielectric material having a refractive index of 1.7 or greater, and the first low refractive index dielectric layer 32a is formed of a dielectric material having a refractive index of 1.6 or smaller.

Further, the first dielectric layer multilayer film 32 is formed by sequentially and alternately laminating the first low refractive index dielectric layer 32a and the first high refractive index dielectric layer 32b to form plural layers of 40 to 50 layers, using a deposition method, a sputtering method or the like. The first dielectric multilayer film 32 is configured so that, when an incident angle is 40°, a wavelength (wavelength at a transmittance of 50%) in a half value of a peak transmittance of the first dielectric multilayer film 32 shifts to a short wavelength side by about 40 nm compared with a case where the incident angle is 0°, on an infrared region side of the first light transmitting range W1, for example. That is, in the first dielectric multilayer film 32, when the incident angle is 40°, the wavelength in the half value of the peak transmittance of the first light transmitting range W1 on the infrared region side shifts to the short wavelength side by about 40 nm. If the shift amount is large, the incident angle dependency increases.

The second dielectric multilayer film 33 has a second light transmitting range W2 falling within the first light transmitting range W1. As shown in FIG. 4(a), in the second dielectric multilayer film 33 according to an example, the second light transmitting range W2 is in a range from about 410 nm to about 660 nm in a transmittance of 50%. In FIG. 4(a), the second light transmitting range W2 is indicated by reference sign W2.

Further, the second dielectric multilayer film 33 has an average refractive index higher than that of the first dielectric multilayer film 32. In order to set the average refractive index of the second dielectric multilayer film 33 to be higher than the average refractive index of the first dielectric multilayer film 32, for example, there is a method in which the second dielectric multilayer film 33 includes a second low refractive index dielectric layer 33a and a second high refractive index dielectric layer 33b which are plural dielectric layers and the second low refractive index dielectric layer 33a uses a dielectric material having a refractive index higher than the refractive index of the dielectric material of the first low refractive index layer 32a.

Further, there is a method in which a thickness ratio of the plural dielectric layers (the second high refractive index dielectric layer 33b and the second low refractive index dielectric layer 33a) that form the second dielectric multilayer film 33 is set to be different from a thickness ratio of the plural dielectric layers (the first high refractive index dielectric layer 32b and the first low refractive index dielectric layer 32a) that form the first dielectric multilayer film 32. For example, there is a method in which the thickness of the dielectric layer having a high refractive index is set to be relatively greater than the thickness of the dielectric layer having a low refractive index, in the plural dielectric layers.

For example, when the first dielectric multilayer film 32 and the second dielectric multilayer film 33 are respectively made of plural dielectric layers which are silicon dioxide ($SiO_2$: low refractive index layer) and titanium dioxide ($TiO_2$: high refractive index layer), by setting the thickness ratio of the silicon dioxide ($SiO_2$) with respect to the titanium dioxide ($TiO_2$) in the second dielectric multilayer film 33 to be smaller than the thickness ratio of the silicon dioxide ($SiO_2$) with respect to the titanium dioxide ($TiO_2$) in the first dielectric multilayer film 32, the second dielectric multilayer film 33 can have the average refractive index higher than the average refractive index of the first dielectric multilayer film 32.

As the second dielectric multilayer film 33 has the average refractive index higher than that of the first dielectric multilayer film 32, the second dielectric multilayer film 33 has a small influence on the light transmittance due to the light incident angle, compared with the first dielectric multilayer film 32.

As shown in FIG. 4(a), the second dielectric multilayer film 33 is configured so that the transmittance of ultraviolet rays falling within a wavelength range shorter than 400 nm is reduced and the transmittance of infrared rays falling within a wavelength range longer than 650 nm is reduced. In order to obtain such a filter characteristic, the second dielectric multilayer film 33 includes the second low refractive index dielectric layer 33a and the second high refractive index dielectric layer 33b. The second high refractive index dielectric layer 33b is formed of a dielectric material having a refractive index of 2.0 or greater, and the second low refractive index dielectric layer 33a is formed of a dielectric material having a refractive index of 0.1 or greater than the dielectric material of the second high refractive index dielectric layer 33b.

Further, the second dielectric multilayer film 33 is formed by sequentially and alternately laminating the second low refractive index dielectric layer 33a and the second high refractive index dielectric layer 33b to form plural layers of 40 to 50 layers, using a deposition method, a sputtering method or the like.

The second dielectric multilayer film 33 is configured so that, when the incident angle is 40°, a wavelength (wavelength at a transmittance of 50%) in a half value of a peak transmittance of the second dielectric multilayer film 33 shifts to a short wavelength side by about 20 nm compared with a case where the incident angle is 0°, on an infrared region side of the second light transmitting range W2. That is, in the second dielectric multilayer film 33, when the incident angle is 40°, the wavelength in the half value of the peak transmittance of the second light transmitting range W2 on the infrared region side shifts to the short wavelength side by about 20 nm.

Even at a maximum incident angle that is predicted in advance, by setting the wavelength in the half value of the peak transmittance of the second light transmitting range W2 of the second dielectric multilayer film 33 on the infrared region side on the short wavelength side compared with the wavelength in the half value of the peak transmittance of the first light transmitting range W1 of the first dielectric multilayer film 32 on the infrared region side, the wavelength in the half value of the peak transmittance of the second light transmitting range W2 of the second dielectric multilayer film 33 on the infrared region side can be set as a wavelength in a half value of a peak transmittance in a light transmitting range when light passes through the optical films of the first dielectric multilayer film 32 and the second dielectric multilayer film 33, and thus, it is possible to reduce the angle dependency of the transmittance with respect to the incident angle of the optical films.

In this way, in the optical filter member 3, the optical film is configured so that the second light transmitting range W2 falls within the first light transmitting range W1 (first light transmitting range W1 falls within the wavelength range of visible light) and the second dielectric multilayer film 33 has the average refractive index higher than that of the first dielectric multilayer film 32. Thus, the imaging device is formed so that a color tone difference between a part in the vicinity of the center and its peripheral part is reduced due to the difference of the light incident angles, to thereby improve the image quality.

When an overall average refractive index of the first dielectric multilayer film 32 is n32, an overall average refractive index of the second dielectric multilayer film 33 is n33, the refractive indexes of the respective layers of the dielectric materials of the first and second high refractive index dielectric layers 32b and 33b and the dielectric materials of the first and second low refractive index dielectric layers 32a and 33a are n1, n2, n3, and n4, the numbers of the respective layers are p1, p2, p3, and p4, and the thicknesses of the respective layers are t1, t2, t3, and t4, the average refractive indexes n32 and n33 may be expressed as the following equations 1 and 2. Here, n33 is greater than n32.

$$n32 = \left(\sum_{K=1}^{P1} n1 t1k + \sum_{K=1}^{P2} n1 t1k\right) \bigg/ \left(\sum_{K=1}^{P1} t1k + \sum_{K=1}^{P2} t1k\right)$$

$$n33 = \left(\sum_{K=1}^{P3} n3 t3k + \sum_{K=1}^{P4} n4 t4k\right) \bigg/ \left(\sum_{K=1}^{P3} t3k + \sum_{K=1}^{P4} t4k\right)$$

When at least a part of the plural dielectric layers of the first and second dielectric multilayer films 32 and 33 are formed of the same dielectric material and the dielectric layers formed of the same dielectric material in both the first and second dielectric multilayer films 32 and 33 are in contact with the base 31, it is possible to improve the bonding strengths of the first dielectric multilayer film 32 and the second dielectric multilayer film 33 with respect to the base 31.

As a structure in which at least a part of the plural dielectric layers of the first and second dielectric multilayer films 32 and 33 are formed of the same dielectric material, there are the following three examples.

The first example is a structure in which the low refractive index dielectric layers and the high refractive index dielectric layers of the plural dielectric layers of the first and second dielectric multilayer films 32 and 33 are formed of the same dielectric material. For example, the first dielectric multilayer film 32 is formed of a silicon dioxide layer ($SiO_2$: low refractive index layer) and a titanium dioxide layer ($TiO_2$: high refractive index layer), and the second dielectric multilayer film 33 is formed of a silicon dioxide layer ($SiO_2$: low refractive index layer) and a titanium dioxide layer ($TiO_2$: high refractive index layer). For example, when the base 31 includes silicon dioxide ($SiO_2$) as a main component, if the silicon dioxide layers ($SiO_2$ layer: low refractive index layer) in both of the first and second dielectric multilayer films 32 and 33 are in contact with the base 31, the bonding strengths of the first dielectric multilayer film 32 and the second dielectric multilayer film 33 with respect to the base 31 can be improved.

The second example is a structure in which either of the low refractive index dielectric layers or the high refractive index dielectric layers among the plural dielectric layers of the first and second dielectric multilayer films 32 and 33 are formed of the same dielectric material. In this case, the remaining of the low refractive index dielectric layers and the high refractive index dielectric layers may be formed of different dielectric materials. For example, the first dielectric multilayer film 32 is formed of a silicon dioxide layer ($SiO_2$ layer: low refractive index layer) and a tantalum pentoxide layer ($Ta_2O_5$ layer: high refractive index layer), and the second dielectric multilayer film 33 is formed of a silicon dioxide layer ($SiO_2$ layer: low refractive index layer) and a titanium dioxide layer ($TiO_2$ layer: high refractive index layer). For example, when the base 31 includes silicon dioxide ($SiO_2$) as a main component, if the silicon dioxide layers ($SiO_2$ layer: low refractive index layer) in both of the first and second dielectric multilayer films 32 and 33 are in contact with the base 31, the bonding strengths of the first dielectric multilayer film 32 and the second dielectric multilayer film 33 with respect to the base 31 can be improved.

The third example is a structure in which the low refractive index dielectric layers of one dielectric multilayer film among the first and second dielectric multilayer films 32 and 33 and the high refractive index dielectric layers of the other dielectric multilayer film among the first and second dielectric multilayer films 32 and 33 are formed of the same dielectric material. The third dielectric multilayer film 34 includes a third low refractive index layer 34a and a third high refractive index layer 34b, and has a third light transmitting range W3. The third light transmitting range W3, within which the second light transmitting range W2 falls, does not transmit light having twice a wavelength of a central wavelength of the second light transmitting range W2. Further, the third light transmitting range W3 has an upper limit wavelength higher than an upper limit wavelength of the first transmitting range W1. As shown in FIG. 4(b), in the third dielectric multilayer film 34 according to an example, the third light transmitting range W3 is a range from about 420 nm to about 920 nm at a transmittance of 50%. In FIG. 4(b), the third light transmitting range is indicated by reference sign W3. Further, the equation that the light transmitting range does not transmit light of a certain wavelength means that the transmittance of the light of the wavelength is lower than 10%.

Here, a configuration in which the third light transmitting range W3 does not transmit the light having twice the wavelength of the central wavelength of the second light transmitting range W2 is designed to block light of a wavelength range W4 transmitted in the second dielectric multilayer film 33 by the third dielectric multilayer film 34. The wavelength of the light that passes through the second dielectric multilayer film 33 and the third dielectric multilayer film 34 is blocked in the wavelength range W4, as shown in FIG. 5(a).

In the optical filter member 3, as the third dielectric multilayer film 34 includes the second light transmitting range W2 of the second dielectric multilayer film 33 and the third light transmitting range W3 blocks the light having twice the wavelength of the central wavelength of the second light transmitting range W2, it is possible to block light in a wavelength range that cannot be blocked only by the second dielectric multilayer film 33, by the third dielectric multilayer film 34.

Figure 3:
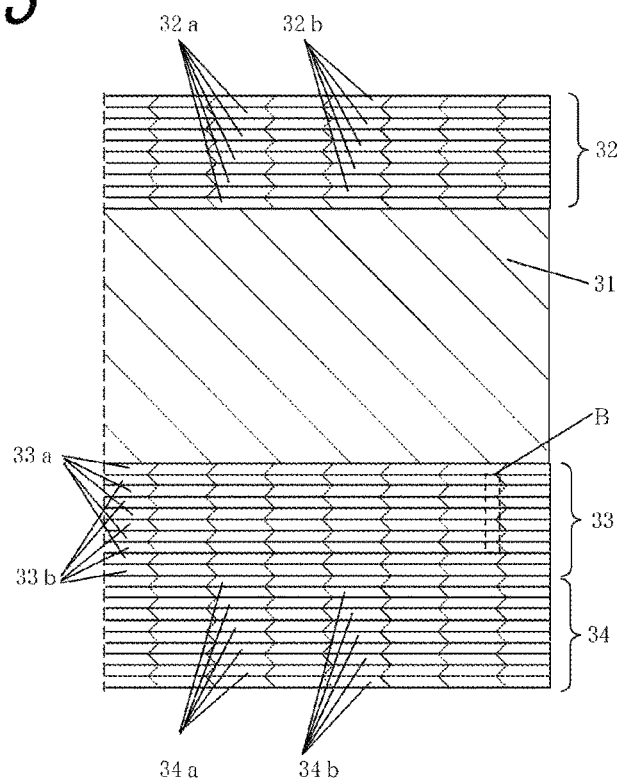
FIG. 3 is an enlarged view of a section indicated by reference sign A in the optical filter member shown in FIG. 2.
Figure 4:
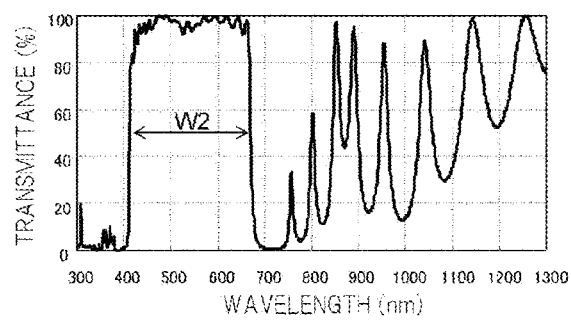
FIG. 4(a) is a graph illustrating a transmission characteristic of a second dielectric multilayer film in the optical filter member according to the embodiment of the invention.
FIG. 4(b) is a graph illustrating a transmission characteristic of a third dielectric multilayer film.
Figure 4:
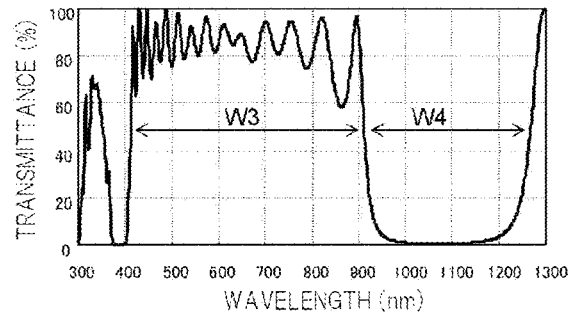
Figure 5:
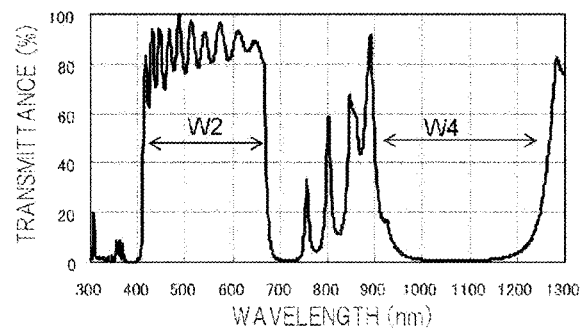
FIG. 5(a) is a graph illustrating a transmission characteristic when both of the second and third dielectric multilayer films in the optical filter member according to the embodiment of the invention transmit light.
FIG. 5(b) is a graph illustrating a transmission characteristic of a first dielectric multilayer film.
FIG. 5(c) is a graph illustrating a transmission characteristic of the optical filter member.
Figure 5:
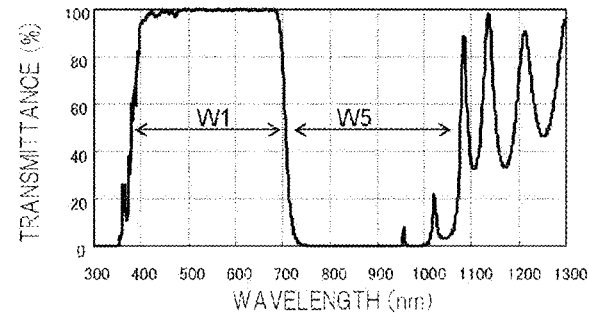
Figure 5:
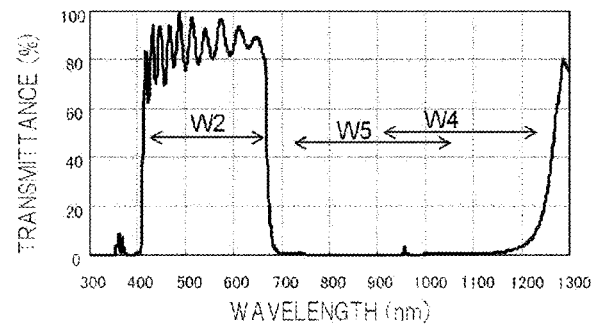

In the example shown in FIG. 3, the second dielectric multilayer film 33 and the third dielectric multilayer film 34 are formed on the same main surface side of the base 31, and both of the second dielectric multilayer film 33 and the third dielectric multilayer film 34 are formed on a lower surface side of the base 31.

As the second dielectric multilayer film 33 and the third dielectric multilayer film 34 are formed on the same main surface side of the base 31, for example, even though the third light transmitting range W3 is designed to be twice the second light transmitting range W2 with reference to a lower limit wavelength (for example 400 nm) of the second light transmitting range W2 of the second dielectric multilayer film 33 and a lower limit wavelength (for example 400 nm) of the third light transmitting range W3 of the third dielectric multilayer film 34, by forming the second dielectric multilayer layer 33 and the third dielectric multilayer film 34 under the same deposition condition, it is possible to reduce deviation of the lower limit wavelength of the second light transmitting range W2 of the second dielectric multilayer film 33 and the lower limit wavelength of the third light transmitting range W3 of the third dielectric multilayer film 34, to thereby secure a desired light transmitting range. Further, as the third light transmitting range W3 has the same lower limit wavelength as the lower limit wavelength of the second light transmitting range, it is possible to obtain a desired light transmitting range.

Here, the desired light transmitting range refers to the second light transmitting range W2. For example, if the deposition conditions of the second dielectric multilayer film 33 and the third dielectric multilayer film 34 are different from each other and the lower limit wavelength of the third light transmitting range W3 of the third dielectric multilayer film 34 shifts to a long wavelength side with reference to the lower limit wavelength of the second light transmitting range W2 of the second dielectric multilayer film 33, a part of the second light transmitting range W2 is cut, that is, a part of the second light transmitting range W2 becomes a range that does not transmit light, and the desired second light transmitting range W2 cannot be secured. Since the third light transmitting range W3 includes the lower limit wavelength of the second light transmitting range W2, it is possible to prevent a part of the second light transmitting range W2 from being cut.

As described later, it is preferable that the first dielectric multilayer film 32, the second dielectric multilayer film 33, and the third dielectric multilayer film 34 are formed by an ion beam assisted deposition method. The optical filter member 3 obtained by combining the above-mentioned dielectric multilayer films is configured so that the transmittance of ultraviolet rays falling within a wavelength range shorter than 400 nm is reduced and the transmittance of infrared rays falling within a wavelength range longer than 650 nm is reduced, as shown in FIG. 5(c). The transmittance of the optical filter member 3 at each wavelength becomes a product of the transmittances of the base 31 in each wavelength, transmittance of the first dielectric multilayer film 32, the transmittance of the second dielectric multilayer film 33, and the transmittance of the third dielectric multilayer film 34 at each wavelength. Since the base 31 has an approximately flat transmittance in a range from the visible light range to 1200 nm, this range is not considered.

In this way, by reducing the influence of the light incident angle in the optical film, it is possible to reduce the influence of the light incident angle in the entire optical filter member 3.

As a high refractive index dielectric material having a refractive index of 1.7 or greater suitable for the first high refractive dielectric layer 32b of the first dielectric multilayer film 32 and the third high refractive index dielectric layer 34b of the third dielectric multilayer film 34, for example, tantalum pentoxide (refractive index: 2.16), titanium dioxide (refractive index: 2.52), niobium pentoxide (refractive index: 2.33), lanthanum oxide (refractive index: 1.88), zirconium dioxide (refractive index: 2.40), or the like is used. As a low refractive index dielectric material having a refractive index of 1.6 or lower suitable for the first low refractive dielectric layer 32a and the third low refractive index dielectric layer 34a, for example, silicon dioxide (refractive index: 1.46), lanthanum fluoride (refractive index: 1.59), magnesium fluoride (refractive index: 1.38), or the like is used. In view of a mechanical characteristic such as hardness or stability and an optical characteristic such as a refractive index necessary for assigning a function as a desired optical filter, it is preferable that titanium dioxide is used as the first and third high refractive index dielectric layers 32b and 34b and silicon dioxide be used as the first and third low refractive index dielectric layers 32a and 34a.

Figure 6:
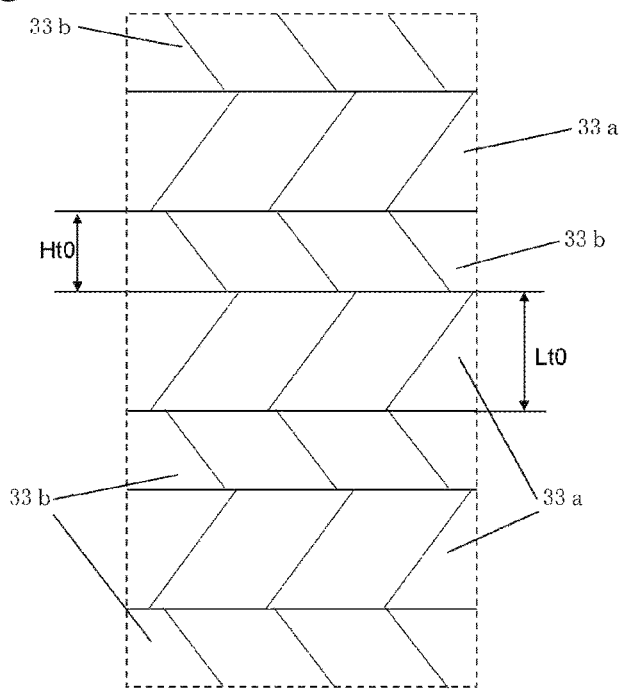
FIG. 6 is an enlarged view of a section of the second dielectric multilayer film indicated by reference sign B in the optical filter member shown in FIG. 3.

Further, as a method for setting the average refractive index of the second dielectric multilayer film 33 to be higher than the average refractive index of the first dielectric multilayer film 32, there is a method in which the second low refractive index dielectric layer 33a uses a dielectric material having a refractive index higher than the refractive index of the dielectric material of the first low refractive index multilayer 32a. In this case, an enlarged structure of the dielectric layers of a section B in FIG. 3 is similar to the first dielectric multilayer film 32, as shown in FIG. 6. Here, when respective physical film thicknesses of the second low refractive index dielectric layer 33a and the second high refractive index dielectric layer 33b are Lt0 and Ht0 and respective refractive indexes thereof are nL0 and nH0, the optical film thicknesses satisfy Lt0×nL0=Ht0×nH0 so that the optical film thicknesses are approximately the same.

As a specific material, the following dielectric material is used. As the dielectric material of the second high refractive index multilayer 33b having a high refractive index of 2.0 or greater suitable for the second dielectric multilayer film 33, for example, tantalum pentoxide (refractive index: 2.16), titanium dioxide (refractive index: 2.52), niobium pentoxide (refractive index: 2.33), zirconium dioxide (refractive index: 2.40), or the like is used. As the dielectric material of the second low refractive index dielectric layer 33a of which the refractive index is smaller than the dielectric material of the high refractive index by 0.1 or greater, for example, tantalum pentoxide (refractive index: 2.16), niobium pentoxide (refractive index: 2.33), zirconium dioxide (refractive index: 2.40), silicon dioxide (refractive index: 1.46), or the like is used with respect to the titanium dioxide (refractive index: 2.52).

Figure 7:
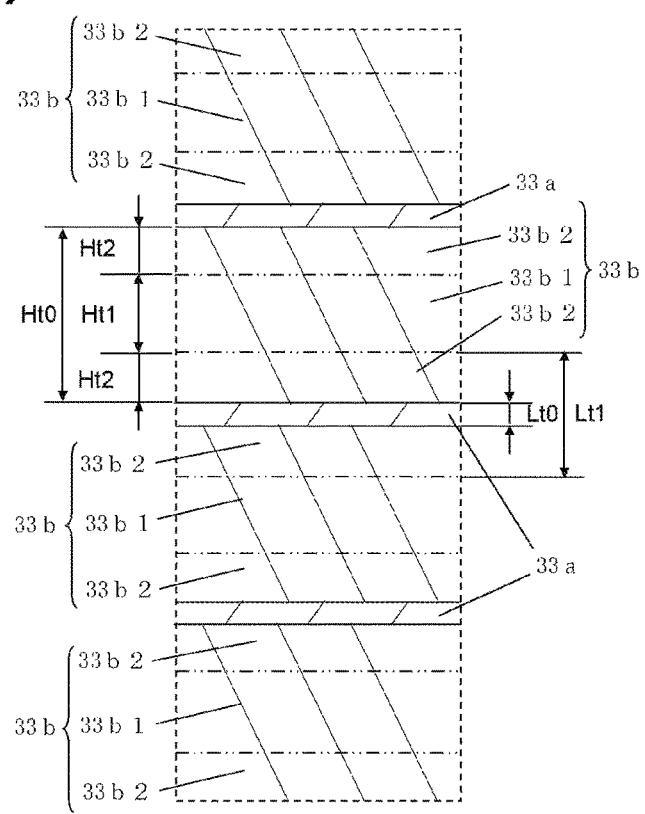
FIG. 7 is an enlarged view of another example of the portion of the second dielectric multilayer film indicated by reference sign B in the optical filter member shown in FIG. 3.

The material may be selected according to the refractive index of the dielectric material to be used, but in order to reduce the angle dependency of the second dielectric multilayer film 33, it is preferable that the average refractive index of the dielectric material of the high refractive index of the second high refractive index dielectric layer 33b of the second dielectric multilayer film 33 and the dielectric material of the low refractive index of the second low refractive index dielectric layer 33a thereof is large. In view of a mechanical characteristic such as hardness or stability and an optical characteristic such as a refractive index necessary for assigning a function as a desired optical filter, it is preferable that titanium dioxide is used as the second high refractive index dielectric layer 33b and tantalum pentoxide be used as the second low refractive index dielectric layer 33a. Further, there is a method in which the thickness ratio of the plural, dielectric layers that form the second dielectric multilayer film 33 is set to be different from the thickness ratio of the plural dielectric layers that form the first dielectric multilayer film 32. Specifically, for example, as shown in FIG. 7 that illustrates an enlarged structure of the dielectric layers of the section B in FIG. 3, there is a method in which the thickness of the second high refractive index dielectric layer 33b is set to be relatively greater than the thickness of the second low refractive index dielectric layer 33a. In this case, for example, dielectric layers deemed as low refractive index layers by an equivalent membrane theory include the second low refractive index dielectric layer 33a and high refractive index layer portions 33b2 included in a deemed low refractive index dielectric layer on both sides thereof, and the thickness thereof may be deemed as $Lt0+2\times Ht2$. Thus, since an actual thickness $Ht0$ of the second high refractive index dielectric layer 33b becomes $Ht1+2\times Ht2$ that corresponds to an addition of a deemed high refractive dielectric layer portion 33b1 and two high refractive layer portions 33b2 included in the deemed low refractive index dielectric layer, the thickness $Ht0$ can be set to be relatively higher than the actual dielectric thickness $Lt0$ of the second low refractive index dielectric layer 33a.

Through such setting, the first dielectric multilayer film 32, the second dielectric multilayer film 33, and the third dielectric multilayer film 34 can be formed by a combination of the thicknesses of the dielectric layers having the high refractive index having the same composition and the dielectric layers having the low refractive index having the same composition, so that a very small amount of a third composition is prevented from being included in each dielectric layer. Thus, it is possible to reduce factors that affect the filter characteristics, and to form a stable optical characteristic.

Further, since the optical film has two composition types of dielectric layers, the number of processes is reduced. Further, since the glass material or quartz crystal is generally used in the base 31 and silicon oxide having a strong adhesion strength with respect to the glass material or quartz crystal may be used as the second low refractive dielectric layer 33a that is directly formed on the base 31, the adhesion strength of the film increases. Thus, it is possible to prevent permeation of moisture, to thereby enhance the reliability.

As described above, it is preferable that the optical film is formed by the ion beam assisted deposition method. The ion beam assisted deposition method is a vacuum deposition method that uses irradiation of positive ions in addition to a vacuum deposition method that is a deposition process. In the ion beam assisted method, the positive ions are used. The positive ions are generated from plasma obtained by introducing both of inert gas composed of argon and active gas composed of oxygen gas into an ion source of a device, for example.

In the ion beam assisted deposition method, for example, the base 31 is disposed in a deposition dome provided in a vacuum deposition device, oxygen is sufficiently supplied so that oxygen deficiency does not occur in order to obtain an optically excellent optical film, and vacuum deposition is performed while performing irradiation of the positive ions in a state where the inside of the vacuum deposition device is set to a vacuum degree of about $1\times 10-3$ Pa. A surface temperature of the base 31 when the optical film is formed in the vacuum deposition device is managed by measuring a temperature around the base 31 by a thermocouple, and is maintained in a temperature range of about 30 to 350° C. using a heating wire heater or the like.

When the second dielectric multilayer film 33 is disposed, together with the third dielectric multilayer film 34, on the same main surface side of the base 31 and the first dielectric multilayer film 32 is disposed on the other main surface side of the base 31, for example, the first low refractive index dielectric layer 32a and the first high refractive index dielectric layer 32b are sequentially and alternately deposited to form the first dielectric multilayer film 32 on the entire surface of one main surface of the base 31 or in a desired region thereof that faces the imaging element 2 through masking. Further, the second low refractive index dielectric layer 33a and the second high refractive index dielectric layer 33b are sequentially and alternately deposited to form the second dielectric multilayer film 33 on the entire surface of the other main surface of the base 31 or in a desired region that faces the imaging element 2 through masking, and then, the third low refractive index dielectric layer 34a and the third high refractive index dielectric layer 34b are sequentially and alternately deposited to form the third dielectric multilayer film 34 on the second dielectric multilayer film 33. In this way, by sequentially and alternately depositing the dielectric layers while performing the irradiation of the positive ions, a mother optical filter member 3' to become the optical filter member 3 on which the optical film is formed is obtained. The first, second, and third dielectric multilayer films 32, 33, and 34 are deposited as, for example, dielectric layers of a total of about 10 to 50 layers, respectively.

As the positive ions collide with gaseous molecules of deposition matter that move in a vacuum, the gaseous molecules of the deposition matter are excited to obtain a large amount of kinetic energy. Further, if the gaseous molecules of the deposition matter having the large amount of kinetic energy reach the surface of the base 31 that is a deposition target, the gaseous molecules of the deposition matter move over a broad surface of the deposition target, and are highly likely to find a place of the deposition target in a lower energy state according to the movement over the broad region. Thus, the molecules of the deposition matter are uniformly deposited on the surface of the deposition target without being agglutinated, to thereby form an optical film in which the molecules of the deposition matters that are present in a peripheral portion are densely filled without forming nuclei due to agglutination. Accordingly, for example, the optical film is formed to prevent atmospheric moisture from being permeated, to thereby reduce a possibility of being separated from the base 31 that is the deposition target.

It is preferable that the dielectric layer directly formed on the surface of the base 31 is a silicon dioxide film having high adhesion with the glass material to improve the adhesive property between the base 31 and the optical film. Further, as the imaging device according to the present embodiment includes the above-described optical filter member 3, the change of the optical characteristic due to the difference of the light incident angles in the optical filter member 3 is reduced, and the quality of the captured image is improved.

Figure 9:
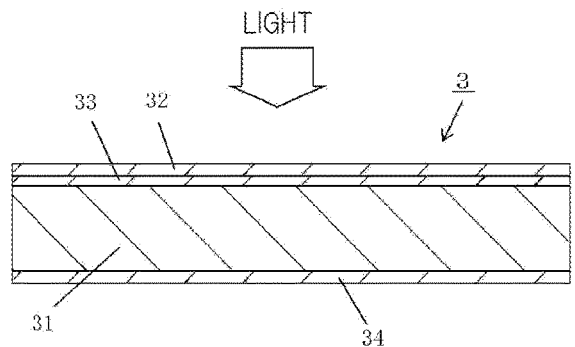
FIG. 9 is a longitudinal sectional view illustrating another example of the optical filter member in the imaging device shown in FIG. 1.
Figure 10:
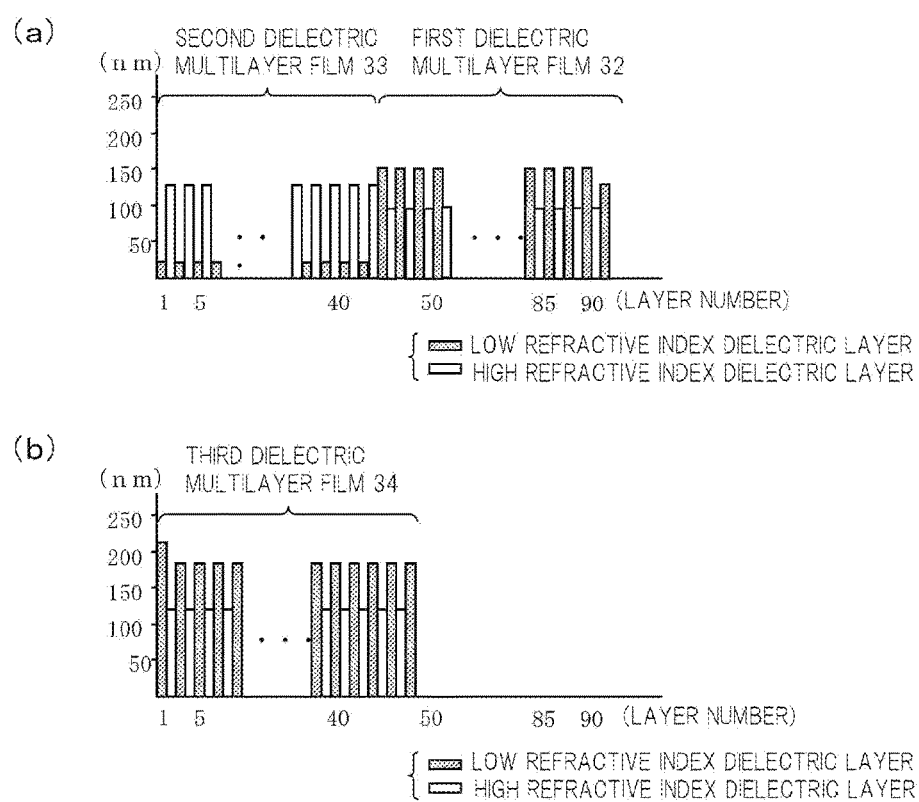
FIG. 10(a) is a graph illustrating an example of distribution of thicknesses of a high refractive index layer and a low refractive index layer of a second and a first dielectric multilayer films in the optical filter member shown in FIG. 9.
FIG. 10(b) is a graph illustrating an example of distribution of thicknesses of a high refractive index layer and a low refractive index layer of the second and a third dielectric multilayer films in the optical filter member shown in FIG. 9.

As described above, an example in which the second dielectric multilayer film 33 is disposed, together with the third dielectric multilayer film 34, on the same main surface side of the base 31 and the first dielectric multilayer film 32 is disposed on the other main surface side of the base 31 has been described. As shown in FIGS. 9 and 10, a configuration in which the second dielectric multilayer film 33 is disposed, together with the first dielectric multilayer film 32, on the same main surface side of the base 31 and the third dielectric multilayer film 34 is disposed on the other main surface side of the base 31 may be used.

In this case, the second dielectric multilayer film 33 is disposed in contact with one main surface of the base 31, and the third dielectric multilayer film 34 is disposed in contact with the other main surface of the base 31. The first dielectric multilayer film 32 is disposed on the second dielectric multilayer film 33.

With such a configuration, as shown in FIG. 5(c), the transmittance of ultraviolet rays falling within a wavelength range shorter than 400 nm is reduced and the transmittance of infrared rays falling within a wavelength range longer than 650 nm is reduced. In this way, by reducing the influence of the light incident angle in the optical film, it is possible to reduce the influence of the light incident angle in the optical filter member 3.

As a formation order of the respective dielectric multilayer films, it is preferable that the second dielectric multilayer film 33 is first formed on the surface of the base 31, and then, the first dielectric multilayer film 32 or the third dielectric multilayer film 34 is formed. This is because, considering that the second dielectric multilayer film 33 most greatly affects the incident angle dependency of the optical filter member 3, by forming the second dielectric multilayer film 33 which is formed with respect to the base 31 with high flatness before being bent due to stress of the dielectric multilayer films, it is easy to uniformly form the deposition films of the respective dielectric multilayer films on the entire surface of the base 31, to thereby reduce film thickness variation or the like in the surface of the optical filter member 3.

Figure 2:
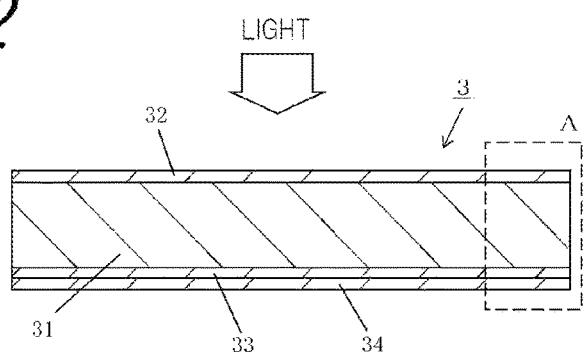
FIG. 2 is a longitudinal sectional view illustrating an optical filter member in the imaging device shown in FIG. 1.

As shown in FIGS. 2 and 9, the second dielectric multilayer film 33 is disposed, together with the first dielectric multilayer film 32 or the third dielectric multilayer film 34, on the same main surface of the base 31. The second dielectric multilayer film 33 has a function of reducing a stress difference generated by the structure difference of the dielectric layers on the upper surface and the lower surface of the base 31, as a function different from the optical characteristic. For example, there is a possibility that stress is generated on the upper surface and the lower surface of the base 31 due to the difference of the dielectric layer structures of the first dielectric multilayer film 32 disposed on the upper surface of the base 31 and the third dielectric multilayer film 34 disposed on the lower surface of the base 31, and the second dielectric multilayer film 33 can reduce the stress difference on the upper surface and the lower surface. When the first dielectric multilayer film 32 and the third dielectric multilayer film 34 are formed on the same main surface side of the base 31, even though the second dielectric multilayer film 33 is formed on the main surface of the base 31 on a side where the dielectric multilayer film is not formed, stress applied to the main surface of the base 31 can be sufficiently reduced.

Figure 11:
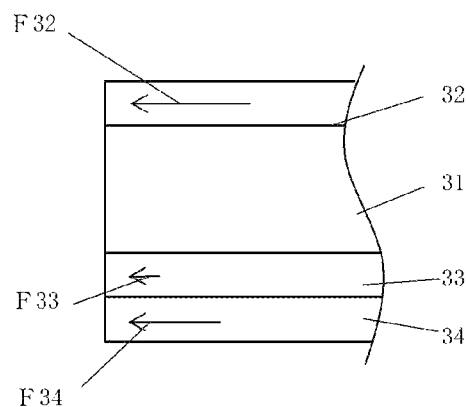
FIG. 11(a) is a schematic diagram illustrating a function of reducing a stress difference in the second dielectric multilayer film in the optical filter member shown in FIG. 2.
FIG. 11(b) is a schematic diagram illustrating a function of reducing a stress difference in the second dielectric multilayer film in the optical filter member shown in FIG. 9.
Figure 11:
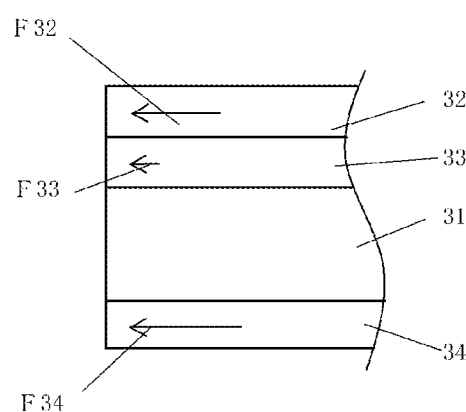

Here, the function of reducing the stress difference by the second dielectric multilayer film 33 will be described with reference to FIGS. 11(a) and 11(b). In FIGS. 11(a) and 11(b), the second dielectric multilayer film 33 reduces a difference between a force F32 applied to the base 31 by the first dielectric multilayer film 32 disposed on the upper surface of the base 31 and a force F34 applied to the base 31 by the third dielectric multilayer film 34 disposed on the lower surface of the base 31 to reduce warping of the base 31. That is, the second dielectric multilayer film 33 reduces the resultant difference of the force F32 and the force F34. In FIGS. 11(a) and 11(b), the values of the force F32 and the force F34 are different from each other, but these values are changed according to the dielectric materials used in the first dielectric multilayer film 32 and the third dielectric multilayer film 34, a desired light transmitting range, or the like.

Figure 8:
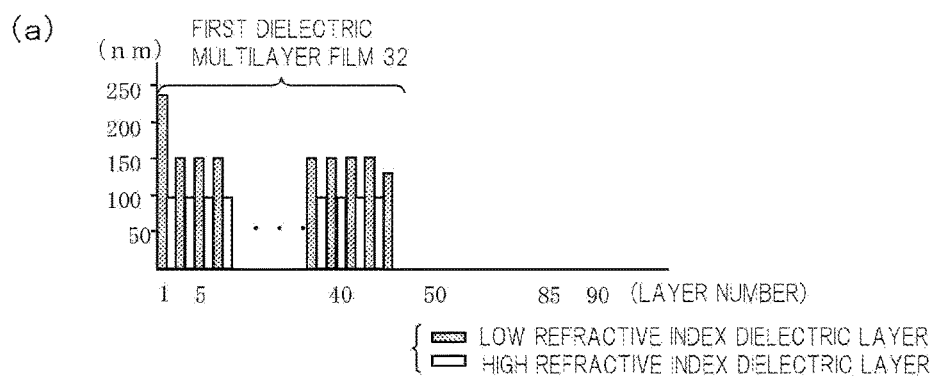
FIG. 8(a) is a graph illustrating an example of distribution of thicknesses of a high refractive index layer and a low refractive index layer of the first dielectric multilayer film in the optical filter member according to the embodiment of the invention.
FIG. 8(b) is a graph illustrating an example of distribution of thicknesses of a high refractive index layer and a low refractive index layer of the second and third dielectric multilayer films in the optical filter member according to the embodiment of the invention.
Figure 8:
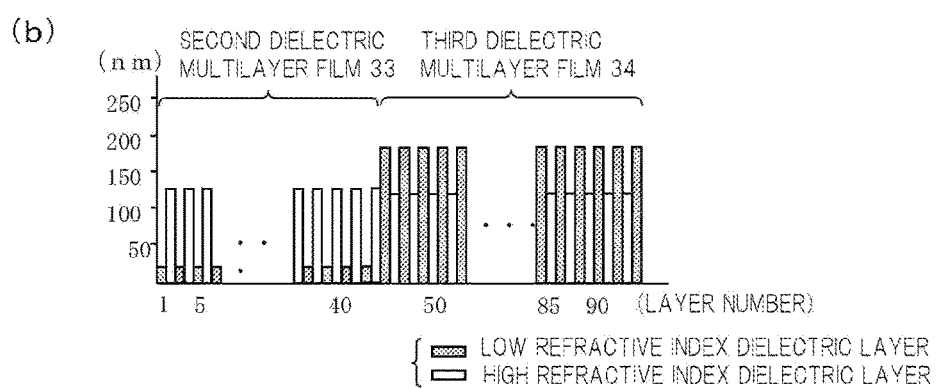

For example, when the low refractive index dielectric layer shown in FIGS. 8 and 10 is formed of silicon dioxide ($SiO_2$) and the high refractive index dielectric layer shown therein is formed of titanium dioxide ($TiO_2$), stress generated during deposition is larger in silicon dioxide ($SiO_2$). In consideration of the low refractive dielectric layer formed of the silicon dioxide ($SiO_2$), in order to reduce the angle dependency of the optical filter member 3, by setting the average refractive index of the second dielectric multilayer film 33 to be higher than the average refractive index of the first dielectric multilayer film 32, the thickness of the second low refractive index dielectric layer 33a in the second dielectric multilayer film 33 is greatly reduced.

Accordingly, if the second dielectric multilayer film 33 is disposed, together with the first dielectric multilayer film 32 or the third dielectric multilayer film 34, on the same main surface side of the base 31, the thickness of the silicon dioxide ($SiO_2$) having large residual stress is smaller than that of the first dielectric multilayer film 32 or the third dielectric multilayer film 34, and thus, the residual stress of the second dielectric multilayer film 33 is greatly reduced compared with the first dielectric multilayer film 32 or the third dielectric multilayer film 34. As a result, since a force F33 applied to the base 31 is smaller than F32 or F34, the balance of the forces applied to the upper and lower surfaces of the base 31 is not greatly deviated, and thus, warping of the base 31 is reduced.

Further, in the example shown in FIGS. 8 and 10, by adjusting the thickness of the silicon dioxide film ($SiO_2$ layer) that is directly formed on the surface of the base 31, it is possible to reduce the difference between F32 and the sum of F33 and F34, to thereby reduce warping of the base 31. Since the silicon dioxide film ($SiO_2$ layer) that is directly formed on the surface of the base 31 almost does not affect the optical characteristic of the dielectric multilayer film, when the stress difference applied to both the main surfaces of the base 31 increases, it is possible to adjust the stress without changing the optical characteristic by adjusting the thickness.

In the invention, since it is possible to reduce the stress difference applied to the main surfaces of the optical filter member 3, in the above example, when the optical filter member 3 is formed on the base 31 so that the thickness of the base 31 is 0.1 mm and the total thickness of the first, second, and third dielectric multilayer films 32, 33, and 34 becomes 0.013 mm, even though a three-point bending strength is measured from any surface, the optical filter member 3 stronger than the three-point bending strength of a single body of the original base 31 is obtained. Here, 0.013 mm represents a thickness that exceeds 10% of the thickness of the base 31.

Figure 12:
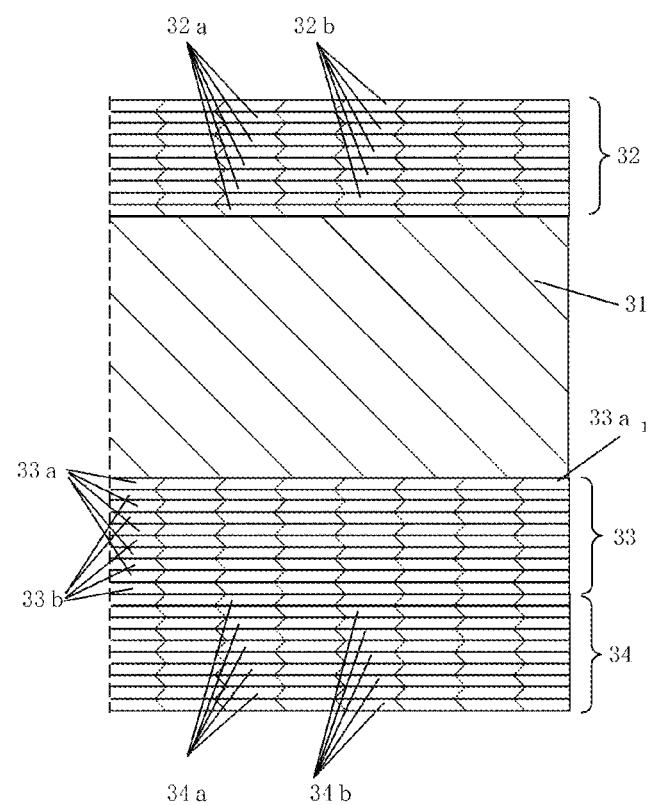
FIG. 12 is a longitudinal sectional view illustrating another example of the optical filter member in the imaging device shown in FIG. 1.
Figure 13:
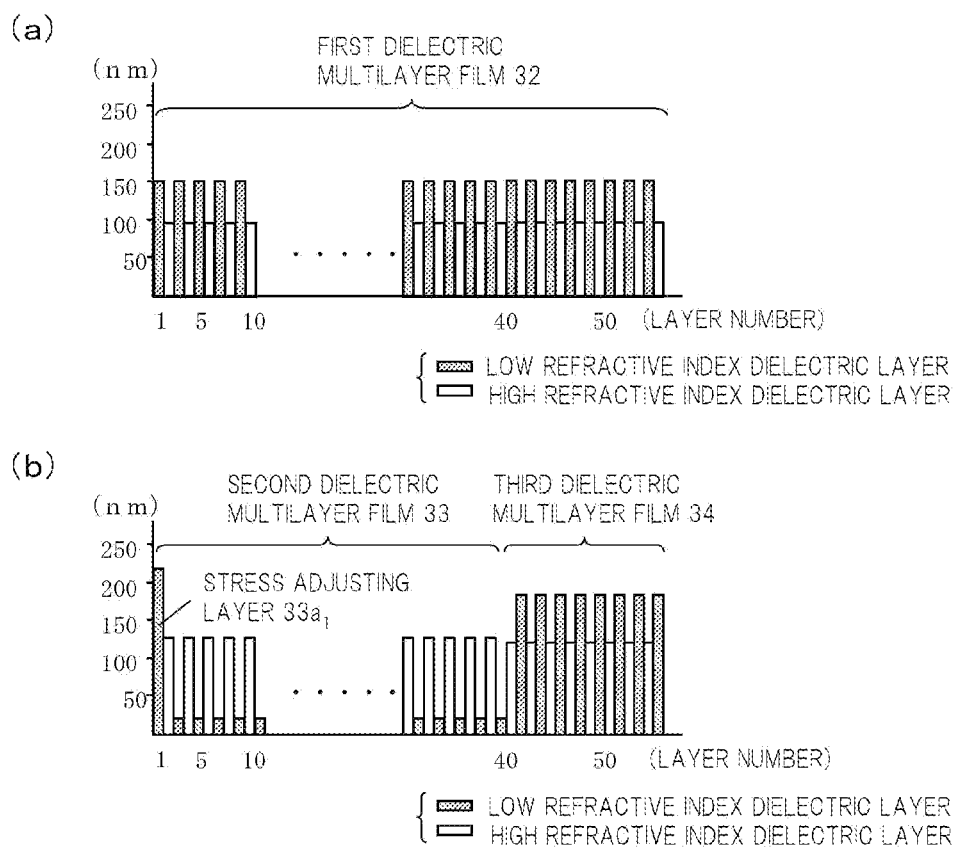
FIG. 13(a) is a graph illustrating an example of distribution of thicknesses of a high refractive index layer and a low refractive index layer of a first dielectric multilayer film in the optical filter member shown in FIG. 12.
FIG. 13(b) is a graph illustrating an example of distribution of thicknesses of a high refractive index layer and a low refractive index layer of a second and a third dielectric multilayer films in the optical filter member shown in FIG. 12.
Figure 14:
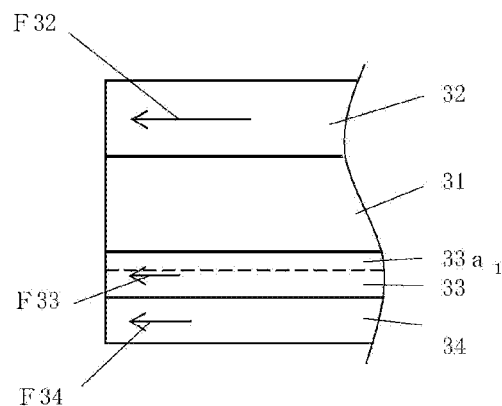
FIG. 14 is a schematic diagram illustrating a function of a stress adjusting layer of the second dielectric multilayer film of the optical filter member shown in FIG. 12.

Further, as shown in FIGS. 12 and 13, the second dielectric multilayer film 33 may include a stress adjusting layer $33a_1$. Here, the "stress adjusting layer $33a_1$" is a layer capable of reducing the stress difference generated on the upper surface and the lower surface of the base 31 due to the difference of the dielectric layer structures of the first dielectric multilayer film 32 disposed on the upper surface of the base 31 and the second dielectric multilayer film 33 and the third dielectric multilayer film 34 disposed on the lower surface of the base 31.

The stress adjusting layer 33a, is a part of the plural second low refractive index dielectric layers 33a of the second dielectric multilayer film 33, and has a different film thickness from that of the other second low refractive dielectric layers 33a. The stress adjusting layer 33a, is designed to have a different film thickness from that of the other second low refractive index layers 33a so that the stress difference generated on the upper surface and the lower surface of the base 31 can be reduced.

Here, a function of the stress adjusting layer $33a_1$ will be described with reference to FIG. 13. The stress adjusting layer $33a_1$ reduces the difference between the force F32 applied to the base 31 by the first dielectric multilayer film 32 disposed on the main surface of the base 31 and the forces F33 and F34 applied to the base 31 by the second and third dielectric multilayer films 33 and 34 disposed on the lower surface of the base 31 to reduce warping of the base 31. That is, the stress adjusting layer $33a_1$ is configured to reduce the difference between F32 and the sum of the forces F33 and F34.

For example, when the low refractive index dielectric layer shown in FIG. 12 is formed of silicon dioxide ($SiO_2$) and the high refractive index dielectric layer is formed of titanium dioxide ($TiO_2$), stress generated during deposition is larger in silicon dioxide ($SiO_2$). In consideration of the low refractive dielectric layer formed of the silicon dioxide ($SiO_2$), in order to realize a desired optical characteristic, the thickness of the low refractive index dielectric layer in the second dielectric multilayer film 33 is set to be extremely small.

In this state, when the stress adjusting layer $33a_1$ is not provided, the force F33 applied to the base 31 becomes extremely small, the balance of the forces applied to the upper and lower surfaces of the base 31 is greatly deviated, and thus, the base 31 may be greatly warped. However, in the example shown in FIG. 12, since the optical film has the stress adjusting layer $33a_1$ having the film thickness larger than that of the other low refractive index dielectric layers in the second dielectric multilayer film 33, the difference between F32 and the sum of F33 and F34 is reduced.

When the stress adjusting layer $33a_1$ is provided as a first layer being in contact with the base 31 in the thickness direction of the second dielectric multilayer film 33, and when the base 31 and the stress adjusting layer $33a_1$ are formed by materials having a relatively small refractive index difference, it is possible to reduce the influence on the optical characteristic due to the difference of the refractive indexes of the base 31 and the stress adjusting layer $33a_1$.

In this respect, it is preferable that the stress adjusting layer $33a_1$ is formed of the same material as the main component of the base 31. For example, when the main component of the base 31 is silicon dioxide ($SiO_2$), it is preferable that the stress adjusting layer $33a_1$ is formed of silicon dioxide ($SiO_2$). With such a configuration, it is possible to reduce the influence on the optical characteristic due to the difference of the refractive indexes of the base 31 and stress adjusting layer $33a_1$.

In the example of the present embodiment, the second dielectric multilayer film 33 includes the plural second low refractive index dielectric layers 33a formed of silicon dioxide ($SiO_2$) and the plural second high refractive index dielectric layers 33b formed of titanium dioxide ($TiO_2$), in which the main component of the base 31 is silicon dioxide ($SiO_2$), and the stress adjusting layer 33a, is formed of silicon dioxide ($SiO_2$). When the main component of the base 31 is silicon dioxide ($SiO_2$) and the stress adjusting layer $33a_1$ is formed of the same silicon dioxide ($SiO_2$) as the main component of the base 31, the bonding strength of the stress adjusting layer $33a_1$ with respect to the base 31 is improved, and for example, the stress adjusting layer $33a_1$ is less prone to be separated from the base 31, thereby making it possible to improve the optical characteristic in the optical filter member 3.

Further, the optical film of the optical filter member 3 may use a transmission electron microscope to confirm the film thickness, the composition, the crystalline state of the film, or the like. By specifying the composition of the film, it is possible to confirm respective refractive indexes from the film composition using literature or the like.

Hereinafter, configurations other than the optical filter member 3 in the imaging device will be described.

The element mounting member 1 includes a substrate 11, and a frame body 12 bonded to the substrate 11 with a lead terminal 13 being interposed therebetween.

The substrate 11 is formed of an aluminum oxide-based sintered compact (alumina ceramics), a mullite sintered compact, a steatite sintered compact, an aluminum nitride sintered compact, or the like, for example.

The substrate 11 may be manufactured as follows. For example, when the substrate 11 is formed of the aluminum oxide-based sintered compact, for example, first, appropriate organic binder, solvent, plasticizer, and dispersing agent are admixed into base powder such as aluminum oxide, silicon oxide, magnesium oxide or calcium oxide to prepare a slurry, and then, the slurry is made into granules using a spray method known in the related art. Then, the granules are subjected to powder press molding by a press mold having a predetermined shape to manufacture a green molded body, and then, the green molded body is fired at a temperature of about 1500° C. to form the substrate 11. Further, the green molded body may be obtained by manufacturing a green sheet using the slurry matter, and subjecting the green sheet to a punching process or otherwise by a punching die or the like to form the green molded body having an appropriate size. The green molded body may have a predetermined thickness by laminating the plural green sheets.

If the surface of the substrate 11 is flattened by lap polishing or otherwise to have a flatness of 20 μm or smaller, since inclination or distortion is less prone to occur when the imaging element 2 is mounted, which is preferable. In the substrate 11, the frame body 12 is bonded to a peripheral part of a mounting portion for the imaging element 2. Here, if a portion of the peripheral part that faces the frame body 12 is flattened, the frame body 12 is less prone to be inclined. Accordingly, since the substrate 11 and the frame body 12 are satisfactorily bonded to each other, and the optical filter member 3 is bonded thereon and is less prone to be inclined with respect to the imaging element 2, which is preferable.

The lead terminal 13 is formed of a metal material such as an Fe—Ni—Co alloy, an Fe—Ni alloy, copper (Cu) or a copper alloy. In view of airtight reliability, it is preferable that the lead terminal 13 is formed of a material having a thermal expansion coefficient having a small difference with a thermal expansion coefficient of the substrate 11. If the substrate 11 is formed of the aluminum oxide-based sintered compact, for example, an Fe-42% Ni alloy is preferable. In order to prevent corrosion or improve electrical conductivity, the lead terminal 13 may be sequentially coated by a nickel-plated layer or a gold-plated layer on the surface thereof.

With respect to the lead terminal 13, a lead frame is formed by subjecting a sheet formed of the metal material to a punching process using a die, for example. The lead frame has such a shape that plural lead terminals 13 are deployed to extend inward from an inner peripheral part of a frame. Further, the plural lead terminals 13 are obtained by connecting the lead frame to the substrate 11 and then detaching a frame. The lead frame may be manufactured by an etching process. The lead frame may be manufactured by forming a resist film of a lead frame shape on a metal, plate, and for example, if the lead terminal 13 is formed of copper, by performing etching using ferric chloride and separating the resist film.

The frame body 12 is formed of ceramics such as an aluminum oxide-based sintered compact (alumina ceramics), a mullite sintered compact, a steatite sintered compact or an aluminum nitride sintered compact, similar to the substrate 11, and may be manufactured by the same method as the substrate 11. If the frame body 12 and the substrate 11 are formed of the same material, the thermal expansion coefficients are the same, since a thermal stress generated therebetween is less prone to be applied to a bonding member 14 or the lead wire 13 provided therebetween, which is preferable.

If the surface of the frame body 12 is flattened by lap polishing or otherwise to have a flatness of 20 µm or smaller, the frame body 12 is less prone to be inclined with respect to the substrate 11. Further, since the optical filter member 3 is bonded to the frame body 12, the optical filter member 13 is less prone to be inclined with respect to the frame body 12. In this way, since in the imaging device, the substrate 11, the frame body 12, and the optical filter member 3 are bonded to each other in a state of being less prone to be inclined, as a result, the optical filter member 3 is bonded so as not to be inclined with respect to the imaging element 2, which is preferable.

The bonding member 14 bonds the substrate 11 and the frame body 12 with the lead terminal 13 being interposed between the bonding members 14, and may be formed of a glass material or a resin material. The bonding member 14 employs a low melting point glass such as PbO based glass, PbO—SiO based glass, BiO—SiO based glass, PO—SiO based glass or BO—SiO based glass, as the glass material. The bonding member 14 employs an epoxy resin, a polyimide resin, a polyamide-imide resin, a polyetherimide resin, or the like, as the resin material. In any case, in order for the bonding member 14 to have a thermal expansion coefficient close to the thermal expansion coefficient of the substrate 11 or the frame body 12, the bonding member 14 may contain a filler of inorganic powder such as silica, for example.

If the bonding member 14 is formed of the low-melting point glass, for example, glass paste is obtained by admixing an appropriate organic solvent or solvent into powder obtained by adding powder of a zirconium silica base compound of 4 to 15% by mass as a filler to a glass component containing lead oxide of 56% to 66% by mass, boron oxide of 4 to 14% by mass, silicon dioxide of 1 to 6% by mass and zinc oxide of 1 to 11% by mass. The glass paste is print-coated on the lower surface of the frame body 12 at a predetermined thickness by a printing method such as a screen printing method, and the resultant is fired at a temperature of about 430° C., to thereby deposit the low melting point glass on the frame body 12.

The frame body 12 is mounted on the substrate 11 with the low melting point glass being directed downward, and then, heating is performed at a temperature of about 470° C. by a heater such as a tunnel type atmosphere furnace or an oven to melt the bonding member 14 again, so that the periphery of each lead terminal. 13 interposed between the upper surface of the substrate 11 and the outer peripheral part of the frame body 12 is covered by the bonding member 14. Then, cooling is performed to solidify the low melting point glass. Thus, the frame body 12 and the lead terminal 13 are strongly bonded to the substrate 11 to form the element mounting member 1.

When the bonding member 14 is resin, for example, epoxy resin paste is obtained by externally adding tetrahydromethylphthalic anhydride of 10% to 30% by mass as a curing agent to a main agent formed of a liquid epoxy resin of bisphenol A type, by externally adding silica powder of 30% to 80% by mass as a filler thereto, and by adding and mixing a colorant such as carbon black or an organic solvent such as 2-methoxyethanol thereto. The epoxy resin is printed and coated on the lower surface of the frame body 12 at a predetermined thickness by a printing method such as a screen printing method, and then, the solvent is dried at a temperature of about 60° C. to about 80° C., to deposit the resin layer on the frame body 12.

The frame body 12 is mounted on the substrate 11 with the bonding member 14 being directed downward, and then, heating is performed at a temperature of about 150° C. for one hour by a heater such as a tunnel type atmosphere furnace or an oven to melt the resin layer. Then, the periphery of each lead terminal 13 interposed between the upper surface of the substrate 11 and the outer peripheral part of the frame body 12 is covered by the bonding member 14, and then, curing is performed. Thus, the frame body 12 and the lead terminal 13 are strongly bonded to the substrate 11 to form the element mounting member 1.

Bonding of the element mounting member 1 manufactured as described above and the optical filter member 3 is performed through an adhesive 5 that is generally made of an ultraviolet ray curing epoxy resin, a thermal curing epoxy resin or the like. If the bonding of the element mounting member 1 and the optical filter member 3 uses the thermal curing epoxy resin as the adhesive 5, for example, the adhesive 5 is coated on the element mounting member 1 or the optical filter member 3 by a screen printing method, a dispense method or the like known in the related art, the element mounting member 1 and the optical filter member 3 are overlaid, and then, heating is performed at a temperature of 90 to 150° C. for 60 to 90 minutes under pressure. The imaging element 2 is a CCD, a CMOS or the like. The imaging element 2 is bonded and fixed to the upper surface of the element mounting member 1 by a conductive adhesive made of an epoxy resin containing silver powder, for example. The imaging element 2 is provided so that an electrode thereof is connected to a terminal of the element mounting member 1 by a bonding wire 4 made of gold or the like. Further, the optical filter member 3 is bonded to the element mounting member 1 using the adhesive 5 to block an opening portion of the element mounting member 1, to thereby form the imaging device.

Figure 15:
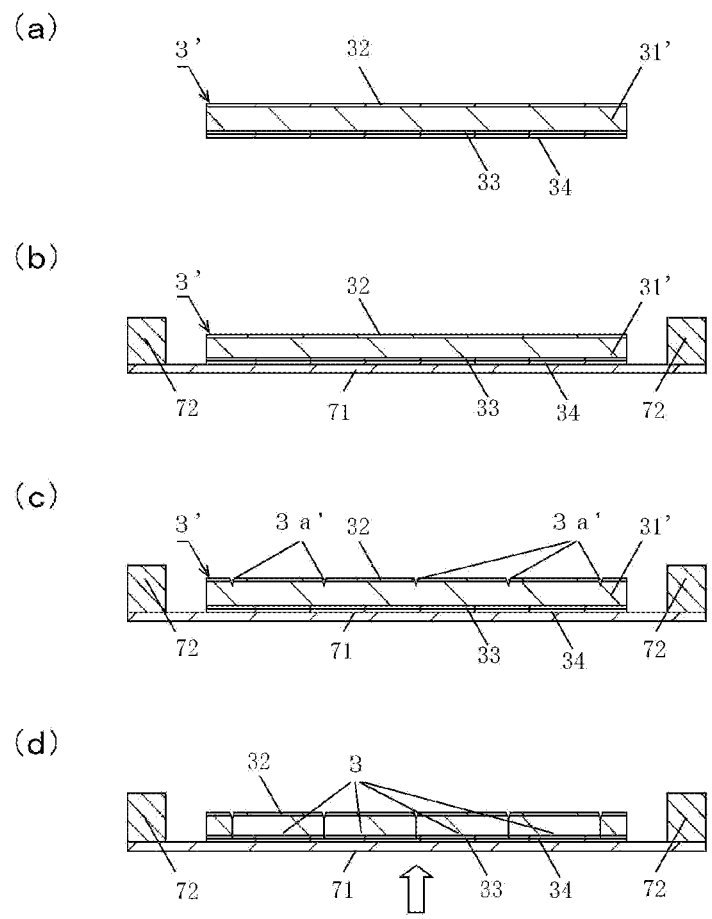
FIGS. 15 (a) to (d) are longitudinal sectional views illustrating a structure obtained by respective processes in a manufacturing method of the optical filter member shown in FIG. 2, respectively.

Hereinafter, a method for manufacturing the optical filter member 3 will be described with reference to FIG. 15. Here, the manufacturing method of the optical filter member 3 as shown in FIG. 2 will be described.

As shown in FIG. 15(a), in the manufacturing method of the optical filter member 3, the first dielectric multilayer film 32 is deposited and formed on one main surface side of a mother base 31' formed of a transparent and colorless flat plate by alternately laminating the first low refractive index dielectric layer 32a and the first high refractive index dielectric layer 32b to form plural layers; the second dielectric multilayer film 33 is deposited and formed on the other main surface side by alternately laminating the second low refractive index dielectric layer 33a and the second high refractive index dielectric layer 33b to form plural layers; and subsequently, the third dielectric multilayer film 34 is deposited and formed thereon by alternately laminating the third low refractive index dielectric layer 34a and the third high refractive index dielectric layer 34b to form plural layers. In this way, the method includes a process of depositing the first dielectric multilayer film 32 and continuously depositing the second dielectric multilayer film 33 and the third dielectric multilayer film 34 to form the mother optical filter member 3'; a process of depositing and attaching and fixing the other main surface of the mother optical filter member 3' to an adhesive sheet 71 supported by the frame 72 at an outer peripheral part thereof, as shown in FIG. 15(b); a process of horizontally and vertically arranging plural optical member regions in the mother optical, filter member 3' and irradiating the first dielectric multilayer film 32 side of the mother optical filter member 3' with an ultraviolet laser for scanning to form a groove 3a' to divide the mother optical filter member 3' into plural optical filter member regions, as shown in FIG. 15(c); and a process of cutting the mother optical filter member 3' along the groove 3a', as shown in FIG. 15(d).

Thus, since the first dielectric multilayer films 32 in the adjacent optical filter member regions are disposed through the groove 3a', the first dielectric multilayer films 32 are prevented from being in contact with each other during the manufacturing process. Even though the optical filter member 3 is formed by attaching the planar mother optical filter member 3' in which the optical film is formed on the main surface of the mother optical filter member 3' to the adhesive sheet 71, it is possible to manufacture the optical filter member 3 with little foreign matter. When forming the groove 3a' by applying the ultraviolet laser, when the optical film formed on the surface of the mother base 31' reflects laser light at a high rate exceeding 85% of the wavelength of the ultraviolet laser emitted, it is necessary to emit the ultraviolet laser having energy capable of performing the processing in spite of the reflection. Further, since the reflectance is changed during processing, it is also difficult to adjust the ultraviolet laser. However, if the optical film formed on the surface of the mother base 31' absorbs or transmits 15% or greater of the wavelength of the emitted ultraviolet laser, it is possible to effectively use the ultraviolet laser for formation of the groove 3', and the change of the reflectance during processing is also reduced. Thus, it is easy to adjust the ultraviolet laser, which is preferable.

The adhesive sheet 71 generally has a two-layer structure of a support sheet and an adhesive layer disposed on one side surface of the support sheet. The thickness of the adhesive sheet 71 is not particularly limited, but the thickness is normally 30 to 300 μm, and preferably, 50 to 100 μm. An adhesive for the adhesive layer may be selected from a compound that forms a pressure reduction adhesive as a pressure reduction adhesive component, and for example, an adhesive such as a rubber-based adhesive, an acrylic-based adhesive, a silicone-based adhesive, a urethane-based adhesive, a polyester-based adhesive or a polyvinyl ether-based adhesive may be used. As necessary, an absorbent for improving the absorptance of laser light may be added to the pressure reduction adhesive component to form an adhesive. The thickness of the adhesive layer is not particularly limited, but the thickness is normally 1 to 100 μm, and preferably, 5 to 50 μm.

A frame body 72 is normally a frame-shaped body on which a linear portion or a groove for positioning is formed on the outer periphery thereof, which is a jig for positioning the mother optical filter member 3' through the adhesive sheet 71. By using such a jig, it is possible to improve mass productivity or reproducibility. The frame body 72 may be manufactured by etching a metal plate of about 0.5 mm to about 1 mm. Further, the frame 72 may be manufactured by a thermoplastic resin by means of injection molding using a mold.

By forming the adhesive layer on the support sheet to form the adhesive sheet 71, bonding the adhesive sheet 71 to the frame body 72 through the adhesive layer, and attaching the mother optical filter member 3' to the adhesive layer at the center thereof, it is possible to improve mass productivity or reproducibility of the laser processing.

A laser device is a device for generating light having coincident wavelength and phase. In the present embodiment, the processing is performed using a laser having an ultraviolet wavelength of 266 nm. The processing may be performed using a carbon dioxide gas laser having a wavelength of about 10 μm, but if the ultraviolet laser is used, since the spot diameter can be narrowed compared with a case where the carbon dioxide gas laser is used, it is possible to reduce the influence on the vicinity of a portion where the ultraviolet laser is applied, and to enlarge a region where an excellent characteristic of the optical film is obtained, which is preferable.

In a laser dicing device used in the present embodiment, laser light is emitted so as to be focused on the first dielectric multilayer film 32 on the upper surface of the mother optical filter member 3' made of the glass material, fixed to the frame 72 through the adhesive sheet 71, to thereby form the groove 3a' in the mother optical filter member 3'. The energy of the ultraviolet laser that passes through the first dielectric multilayer film 32 is converted into heat in a surface portion of the mother optical filter member 3' to melt a part of the surface portion of the mother optical filter member 3'. The first dielectric multilayer film 32 is partially evaporated due to the heat generated at the surface portion of the mother optical filter member 3'.

Since the spot diameter of the ultraviolet laser of 266 nm can be narrowed to about 20 μm and a general glass material absorbs the ultraviolet laser and does not transmit the ultraviolet laser, the influence of heat on the adhesive sheet 71 is small, and thus, it is possible to perform dimension machining with high accuracy. Further, in the portion where the groove 3a' is formed by irradiation of the ultraviolet laser, the first dielectric multilayer film 32 and the base 31 are welded at a portion of the side surfaces thereof to form an integrated glass layer, and thus, permeation of moisture from the side surface is suppressed. Thus, it is possible to obtain a structure having less temporal change of the optical characteristic.

Next, the bottom of each groove 3a' is pushed up from the rear surface of the adhesive sheet 71 to cut the mother optical filter member 3', to thereby form the optical filter member 3.

Next, ultraviolet light is applied to the rear surface of the adhesive sheet 71 to cure the adhesive sheet 71. Thus, the adhesiveness is reduced, so that the optical filter 3 is picked up, and thus, the optical filter member 3 can be manufactured. When cutting the mother optical filter member 3', the cutting may be performed using a dicing saw. In this case, the first dielectric multilayer film 32 and the base 31 are not welded.

Figure 16:
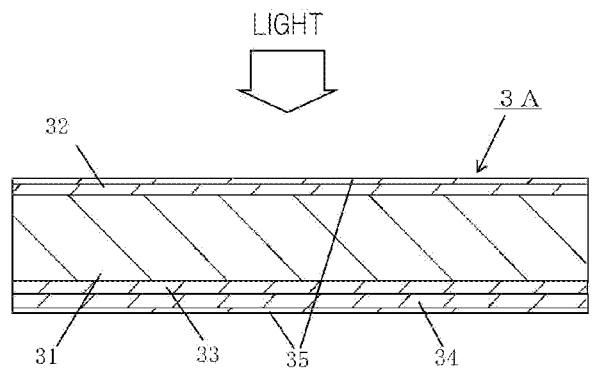
FIG. 16 is a longitudinal sectional view illustrating another example of the optical filter member shown in FIG. 2.

Further, for example, when the base 31 made of the glass material contains a large amount of an alkali metal component and thus has a relatively weak composition with respect to moisture, it is preferable that a barrier film 35 having a property that moisture is less prone to permeate therein is formed on the upper and lower surfaces of the base 31, as shown in FIG. 16.

Further, in the structure of the optical film shown in FIG. 2 or FIG. 9, a part of the first to third dielectric multilayer films 32, 33, and 34 in the thickness direction may be formed to have a function as a barrier layer. This structure is effective when the glass material having a relatively weak composition with respect to moisture is used in the base 31. Examples of this structure include a structure in which a part of the plural high refractive index dielectric layers and low refractive index dielectric layers is formed by an ion beam assisted deposition method to become amorphous. As the part of the plural high refractive index dielectric layers and low refractive index dielectric layers becomes amorphous, the moisture is less prone to pass through the optical film.

Further, Example of a structure in which all of the first to third dielectric multilayer films 32, 33, and 34 have a function of a barrier layer include a structure in which all of the plural high refractive index dielectric layers and low refractive index dielectric layers are formed by the ion beam assisted deposition method to become amorphous.

In the optical filter member 3 according to the present embodiment, when the barrier film 35 having the property that moisture is less prone to permeate therein is included, or when the first to third dielectric multilayer films 32, 33, and 34 have the function as the barrier layer, in the base 31 made of the glass material having a relatively weak property with respect to moisture, deterioration of the surface is reduced, and for example, a possibility of separation or the like of the first to third dielectric multilayer films 32, 33, and 34 is further reduced.

REFERENCE SIGNS LIST

- 1: Element mounting member
- 2: Imaging element
- 3, 3A: Optical filter member
- 31: Base
- 32: First dielectric multilayer film
- 32a: First low refractive index dielectric layer
- 32b: First high refractive index dielectric layer
- 33: Second dielectric multilayer film
- 33a: Second low refractive index dielectric layer
  - 33a₁: Stress adjusting layer
- 33b: Second high refractive index dielectric layer
  - 33b1: Deemed high refractive dielectric layer portion
  - 33b2: High refractive index layer portion included in deemed low refractive index dielectric layer
- 34: Third dielectric multilayer film
- 34a: Third low refractive index dielectric layer
- 34b: Third high refractive index dielectric layer
- 35: Barrier film
- 4: Bonding wire
- 5: Adhesive

The invention claimed is:

1. An optical filter member, comprising:
a base formed of a light transmitting material; and
an optical film disposed on a surface of the base,
the optical film including a first, a second and a third dielectric multilayer films, in the respective multilayer films a plurality of dielectric layers having different refractive indexes being laminated,
the first dielectric multilayer film having a first light transmission range within a wavelength of visible light,
the second dielectric multilayer film having a second light transmission range falling within the first light transmission range and having an average refractive index higher than that of the first dielectric multilayer film,
the third dielectric multilayer film having a third light transmission range within which the second light transmission range falls, the third dielectric multilayer film having an upper limit wavelength higher than an upper limit wavelength of the first light transmission range, the third dielectric multilayer film blocking light having twice a wavelength of a central wavelength of the second light transmission range,
the second dielectric multilayer film being in contact with the base, the second dielectric multilayer film being disposed, together with the first dielectric multilayer film or the third dielectric multilayer film, on a same main surface side of the base.

2. The optical filter member according to claim 1, wherein the second dielectric multilayer film is disposed, together with the third dielectric multilayer film, on a same main surface side of the base.

3. The optical filter member according to claim 1, wherein at least a part of the plurality of dielectric layers of the first and second dielectric multilayer films are formed of a same material, and
the dielectric layers formed of the same material in both of the first and second dielectric multilayer films are in contact with the base.

4. The optical filter member according to claim 1, wherein the second dielectric multilayer film includes a plurality of first dielectric layers formed of silicon dioxide and a plurality of second dielectric layers formed of titanium dioxide, and
the base contains silicon dioxide as a main component.

5. The optical filter member according to claim 1, wherein the second dielectric multilayer film includes a stress adjusting layer.

6. The optical filter member according to claim 5, wherein the stress adjusting layer is disposed in a first layer of the second dielectric multilayer film, which first layer is in contact with the base in a thickness direction of the second dielectric multilayer film, and contains a same material as a main component of the base.

7. The optical filter according to claim 6, wherein the second dielectric multilayer film includes a plurality of first dielectric layers formed of silicon dioxide and a plurality of second dielectric layers formed of titanium dioxide,
the base contains silicon dioxide as a main component, and
the stress adjusting layer contains silicon dioxide.

8. The optical filter member according to claim 1, wherein the optical film is formed by an ion beam assisted deposition method.

9. The optical filter member according to claim 1, further comprising:
a barrier layer disposed on a surface of the optical film.

10. An imaging device, comprising:
the optical filter member according to claim 1; and
an imaging element disposed under the optical filter member.

* * * * *